United States Patent
Lu et al.

(10) Patent No.: US 7,053,547 B2
(45) Date of Patent: May 30, 2006

(54) INCREASED EMISSION EFFICIENCY IN ORGANIC LIGHT-EMITTING DEVICES ON HIGH-INDEX SUBSTRATES

(75) Inventors: Min-Hao Michael Lu, Lawrenceville, NJ (US); James C. Sturm, Princeton, NJ (US); Conor Francis Madigan, Cambridge, MA (US); Raymond Kwong, Plainsboro, NJ (US)

(73) Assignees: Universal Display Corporation, Ewing, NJ (US); The Trustees of Princeton University, Princeton, NJ (US)

( * ) Notice: Subject to any disclaimer, the term of this patent is extended or adjusted under 35 U.S.C. 154(b) by 199 days.

(21) Appl. No.: 10/305,927

(22) Filed: Nov. 27, 2002

(65) Prior Publication Data

US 2004/0007969 A1 Jan. 15, 2004

Related U.S. Application Data

(60) Provisional application No. 60/334,262, filed on Nov. 29, 2001.

(51) Int. Cl.
*H01J 1/62* (2006.01)
*H01J 63/04* (2006.01)

(52) U.S. Cl. .............. 313/506; 313/501; 313/502; 313/504; 313/512

(58) Field of Classification Search .............. 313/501, 313/502, 504, 506, 512
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,371,434 A | 12/1994 | Rawlings | |
| 5,618,626 A | 4/1997 | Nagashima et al. | |
| 5,703,436 A | 12/1997 | Forrest et al. | |
| 5,707,745 A | 1/1998 | Forrest et al. | |
| 5,814,416 A | 9/1998 | Dodabalapur et al. | |
| 5,834,893 A | 11/1998 | Bulovic et al. | |
| 5,844,363 A | 12/1998 | Gu et al. | |
| 5,936,347 A | 8/1999 | Isaka et al. | |
| 5,955,837 A * | 9/1999 | Horikx et al. | 313/506 |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,125,226 A | 9/2000 | Forrest et al. | |
| 6,294,398 B1 | 9/2001 | Kim et al. | |

(Continued)

FOREIGN PATENT DOCUMENTS

| | | |
|---|---|---|
| WO | WO 00/26973 | 5/2000 |
| WO | WO 00/36665 | 6/2000 |
| WO | WO 01/33598 | 5/2001 |

OTHER PUBLICATIONS

U.S. Appl. No. 10/173,682, filed Jun. 18, 2002, Forrest et al.

(Continued)

*Primary Examiner*—Nimeshkumar D. Patel
*Assistant Examiner*—Matt Hodges
(74) *Attorney, Agent, or Firm*—Kenyon & Kenyon LLP

(57) ABSTRACT

A device is provided. The device includes a substrate, a first electrode disposed over the substrate, a small molecule organic emissive layer disposed over the first electrode, and a second electrode disposed over the organic emissive layer. The substrate has a first index of refraction, and the organic emissive layer has a second index of refraction. The first index of refraction is higher than the second index of refraction. The device may have an external electroluminescent efficiency of at least about 56%. Bulky substituents or dopants may be used to decrease the index of refraction and/or the density of the organic emissive layer.

31 Claims, 13 Drawing Sheets

U.S. PATENT DOCUMENTS

| | | | |
|---|---|---|---|
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,489,638 B1 | 12/2002 | Seo et al. | |
| 6,501,217 B1 * | 12/2002 | Beierlein et al. | 313/504 |
| 6,566,805 B1 * | 5/2003 | Tsai et al. | 313/504 |
| 6,703,780 B1 * | 3/2004 | Shiang et al. | 313/504 |
| 2001/0019782 A1 | 9/2001 | Igarashi et al. | |
| 2003/0020399 A1 | 1/2003 | Moller et al. | |

OTHER PUBLICATIONS

U.S. Appl. No. 09/931,948, filed Aug. 21, 2001, Lu et al.

U.S. Appl. No. 10/233,470, filed Sep. 4, 2002, Shtein et al.

M. A. Baldo et al., "Highly efficient phosphorescent emission from organic electroluminescent devices," *Nature*, vol. 395, pp. 151–154. (1998).

M.A. Baldo et al., "Very high–efficiency green organic light–emitting devices based on electrophosphorescence", *Applied Physics Letters*, vol. 75, No. 1, pp. 4–6 (1999).

C. Adachi et al., "Nearly 100% Internal Phosphorescence Efficiency in an Organic Light Emitting Device", *J. Appl. Phys.*, vol. 90, No. 10, pp. 5048–5051 (2001).

H. J. A. Dartnall et al., "Human Visual Pigments: Microspectrophotometric Results from the Eyes of Seven Persons," *Proc. R. Soc. Lond. B*, vol. 220, pp. 115–130 (1983).

M.P. Singh et al., "Synthetic Utility of Catalytic Fe(III)/Fe(II) Redox Cycling Towards Fused Hetercycles: A Facile Access to Substituted Benzimidazole, Bis–benzimidazole and Imidazopyridine Derivatives," *Synthesis 2000*, No. 10, pp. 1380–1390.

S. Lamansky et al. "Synthesis and Characterization of Phosphorescent Cyclometalated Iridium Complexes," *Inorganic Chemistry*, vol. 40, No. 7, pp. 1704–1711 (2001).

R. C. Kwong et al., "High Operational Stability of Electrophosphorescent Devices," *Applied Physics Letters*, vol. 81 No. 1, pp. 162–164 (2002).

S. Lamansky et al., "Highly Phosphorescent Bis–Cyclometalated Iridium Complexes: Synthesis, Photophysical Characterization, and Use in Organic Light Emitting Diodes," *J. Am. Chem. Soc.*, vol. 123, No. 18, pp. 4304–4312 (2001.

Paul C.K. Kwok, et al., "Designing an external efficient of over 30% for Light Emitting Diode", IEEE, 1998.

H. Yokogawa, et al., "New Transparent Substrate with Silica Aerogel Film for Surface–Emissive Devices", Mat. Res. Soc. Symp. Proc., vol. 660, pp. JJ5.19.1–JJ5.19.6, 2001.

D. Daly, et al., "Little Lenses, Major Markets", Photonics Spectra, pp. 120–122, Jul. 2001.

A.N. Safonov, et al., "Modification of polymer light emission by lateral microstructure", Synthetic Metals 116, pp. 145–148, 2001.

Benjamin J. Matterson, et al., "Increased Efficiency and Controlled Light Output from a Microstructured LightEmitting Diode", Adv. Mater., vol. 13, No. 2, pp. 123–127, Jan. 16, 2001.

N. C. Greenham, R. H. Friend, and D. D. C. Bradley, "Angular dependence of the emission from a conjugated polymer light–emitting diode: implications for efficiency calculations", *Adv. Mater.*, vol. 6, pp. 491–494, 1994 no month.

G. Gu, D. Z. Garbuzov, P. E. Burrows, S. Venkatesh, and S. R. Forrest, "High–external–quantum–efficiency organic light–emitting devices", *Opt. Lett.*, vol. 22, pp. 396–398, 1997, no month.

T. Yamasaki et al., "Organic Light Emitting Device With an Ordered Monolayer of Silica Microspheres as a Scattering Medium," *App. Phys. Lett.*, vol. 76, pp. 1243–1245 (2000); no month.

C. F. Madigan, M.–H. Lu, and J. C. Sturm, "Improvement of output coupling efficiency of organic light–emitting diodes by backside substrate modification", *App. Phys. Lett.*, vol. 76, pp. 1650–1652, 2000 no month.

Peter Ho et al., "Towards Solution–Processible Semiconducting Polymer–Based Photonic Devices," *Syn. Met.*, vol. 102, p. 1020 (1999) no month.

V. Bulovic, V. B. Khalfin, G. Gu, and P. E. Burrows, D. Z. Garbuzov, and S. R. Forrest, "Weak microcavity effects in organic light–emitting devices", *Phys. Rev. B*, vol. 58, pp. 3730–3740, 1998, no month.

M.–H. Lu, C. F. Madigan, and J. C. Sturm, "Experiment and modeling of conversion of substrate–waveguided modes to surface–emitted light by substrate patterning", *Mat. Res. Soc. Proc.*, vol. 621, Q3.7, 2000 no month.

E. Hecht, Optics, 3rd ed., pp. 373–376, Addison–Wesley, Reading MA 1998 no month.

C. W. Tang, S. A. VanSlyke, and C. H. Chen, "Electroluminescence of doped organic thin films", *J. Appl. Phys.*, vol. 65, pp.3610–3616, 1989, no month.

M.–H. Lu–, C. F. Madigan, and J. C. Sturm, IEDM 2000 Tech. Dig., 607 (2000), no month.

C.–C. Wu, C.–I. Wu, J. C. Sturm, and A. Khan, "Surface modification of indium tin oxide by plasma treatment: an effective method to improve the efficiency, brightness and reliability of organic light emitting devices," *Appl. Phys. Lett.*, vol. 70, pp. 1348–1350, 1997 no month.

K. J. Shea and D. A. Loy, "Bridged polysilsesquioxanes: molecular engineering of hybrid organic–inorganic materials", MRS Bulletin 26, 368–375 (2001); no month.

P. Amrhein, A. Shivanyuk, D. W. Johnson, and J. Rebek, Jr., "Metal–switching and self–inclusion of functional cavitands", J. Am. Chem. Soc. 124, 10349–10358 (2002); no month.

T. Konishi, A. Ikeda, T. Kishida, B. S. Rasmussen, M. Fujitsuka, O. Ito, and S. Shinkai, "Photoinduced electron transfer between C60–penant calixarene and captured electron donor: improvement of electron–transfer efficiency by applying host–guest chemistry ", J. Phys. Chem. A 106, 10254–10260 (2002); no month.

F. Cacialli, J. S. Wilson, J. J. Michels, C. Daniel, C. Silva, R. H. Friend, N. Severin, P. Samori, J. P. Rabe, M. J. O'Connel, P. N. Taylor and H. L. Anderson, "Cyclodextrin–treaded conjugated polyrotaxanes as insulated molecular wires with reduced interstrand interactions", Nature Materials 1, 160–164 (2002); no month.

K. K. S. Lau, J. A. Caulfield, K. K. Gleason, "Variable angle spectroscopic ellipsometry of fluorocarbon films from hot filament chemical vapor deposition", J. Vac. Sci. Technol. A 18, 2404–2411 (2000); no month.

H. Y. Jeong, Y. K. Lee, A. Talaie, K. M. Kim, Y. D. Kwon, Y. R. Jang, K. H. Yoo, D. J. Choo, and J. Jang, "Synthesis and characterization of the first adamantane–based poly(p–phenylenevinylene) derivative: an intelligent plastic for smart electronic displays", Thin Solid Films 417, 171–174 (2002) no month.

* cited by examiner

INCREASED EMISSION EFFICIENCY IN ORGANIC LIGHT-EMITTING DEVICES ON HIGH-INDEX SUBSTRATES

This application claims priority to U.S. Provisional Application No. 60/334,262, filed on Nov. 29, 2001, which is incorporated by reference in its entirety.

STATEMENT REGARDING GOVERNMENT RIGHTS

This invention was made with Government support under Contract No. 160-6195, awarded by the National Science Foundation, Contract No. 341-4102, awarded by the Defense Advanced Research Project agency, and Contract No. 341-6121, awarded by the New Jersey Commission of Science and Technology. The Government has certain rights in this invention.

FIELD OF THE INVENTION

This invention relates to the field of light-emitting devices and more particularly to organic light-emitting devices (OLEDs) and the emission efficiency thereof.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As the information revolution taking place all round us, there is a tremendous explosion in the amount of data being generated, transmitted, and in need to be analyzed. An information display remains the most efficient way that a person can interact with these data. The display device of choice is a flat-panel display, but the current liquid crystal display (LCD) technology in use by most flat-panel displays is limited in its ability to meet the increasing demands. A new display technology, however, offers considerable promise for overcoming the limitations of the LCD technology. The new technology is based on the application of organic light-emitting devices (OLEDs), which make use of thin film materials that emit light when excited by an electric current.

The typical OLED consists of a multi-layer sandwich of a layer of indium tin oxide (ITO) ($t_{ITO}$~100 nm, $n_{ITO}$~1.8–2.0), one or more organic layers ($t_{org}$~0.1 nm, $n_{org}$=1.6–1.8 or higher), and a cathode (e.g. Mg:Ag, LiF:Al, or Li:Al), where t refers to the layer thickness and n refers to the layer index of refraction. These layers are most often deposited on tip of a planar glass substrate (e.g. soda lime glass, n=1.51), with plastic substrates (n~1.5–1.6) being the most popular substitute. These commonly used substrates whose index of refraction is lower than that of the emitting material will be referred to as the standard substrates herein. For simplicity, the discussion herein will be based on a PVK/Alq$_3$ bi-layer device. However, those skilled in the art will readily understand that the discussion and analysis that follows can readily be extended to single layer devices or other more complicated device structures.

One factor considered in evaluating a display system is the efficiency of conversion of input power to emitted light. In OLED displays, one factor used in determining this system efficiency is the external coupling efficiency ($\eta_{ext}$) with which internally generated light is coupled out of the device. In order to meet expected demands of future display systems, there is a need to improve the coupling efficiency of OLEDs.

In a conventional planar OLED as described above, a large amount of light is waveguided in the substrate, ITO, and organic layers, and emitted through the edge or lost due to absorption. See, N. C. Greenham, R. H. Friend, and D. D. C. Bradley, "Angular dependence of the emission from a conjugated polymer light-emitting diode: implications for efficiency calculations", *Adv. Mater.*, vol. 6, pp. 491–494, 1994. Consequently, various schemes have been proposed to shape the substrate thereby destroying the substrate waveguide and allowing more light to be emitted externally. See, G. Gu, D. Z. Garbuzov, P. E. Burrows, S. Venkatesh, and S. R. Forrest, "High-external-quantum-efficiency organic light-emitting devices", *Opt. Lett.*, vol. 22, pp. 396–398, 1997, T. Yamasaki et al., "Organic Light Emitting Device With an Ordered Monolayer of Silica Microspheres as a Scattering Medium," *App. Phys. Lett.*, vol. 76, pp. 1243–1245 (2000); C. F. Madigan, M.-H. Lu, and J. C. Sturm, "Improvement of output coupling efficiency of organic light-emitting diodes by backside substrate modification", *App. Phys. Lett.*, vol. 76, pp. 1650–1652, 2000, which are incorporated by reference in their entireties. Of these schemes, those that pattern the substrate on the backside (the non-device side) are more compatible with display manufacturing processes. Prior to the present invention, it is believed that these techniques have only been demonstrated on substrates whose index of refraction is less than that of the emitting material.

SUMMARY OF THE INVENTION

A device is provided. The device includes a substrate, a first electrode disposed over the substrate, a small molecule organic emissive layer disposed over the first electrode, and a second electrode disposed over the organic emissive layer. The substrate has a first index of refraction, and the organic emissive layer has a second index of refraction. The first index of refraction is higher than the second index of refraction. The device may have an external electroluminescent efficiency of at least about 56%. Bulky substituents or dopants may be used to decrease the index of refraction and/or the density of the organic emissive layer.

It is accordingly an object of the invention of further improve the increase in coupling efficiency of OLEDs by employing shaped high-index-of-refraction (high-index in short) substrates. Specifically, high-index substrate refers to a substrate whose index of refraction is higher than that of the emitting material. The inventors realize that it can be accomplished by choosing an appropriate substrate whose index of refraction is high, by lowering the index of the emitting material (as disclosed in Peter Ho et al., "Towards Solution-Processible Semiconducting Polymer-Based Photonic Devices," *Syn. Met.*, vol. 102, p.1020 (1999).

There are at least two advantages in employing shaped high-index substrates. First, in OLEDs on planar substrates, light is lost due to waveguiding in both the substrate and the ITO/organic layer. Shaped standard substrates capture light waveguided in the substrate layer and redirect it externally; however, the light in the ITO/organic layer is still lost. Although the external emission of OLEDs on planar standard and high-index substrates are the same, high-index substrates reduce or eliminate the light waveguided in the ITO/organic layer and leaves more light to be harvested by the shaped substrate. The measured total external emission in the entire forward half space and the forward 120° cone from LEDs on shaped standard substrates are increased by factors of 1.5× and 1.7×, respectively, over devices on planar substrates. With the approach of embodiments of the present invention, the amount of increase becomes 2.3× and 2.9× over OLEDs fabricated on planar substrates—a further improvement of 80% and 120%, respectively, Furthermore, OLEDs fabricated on high-index substrate whose backside is roughened by abrasion shows an increase of 39% in total external emission over an OLED on un-roughened substrates, compared with only a 17% increase for OLEDs on a similarly treated standard glass substrate.

A second advantage of high-index substrate is that the rays of light in the substrate are refracted towards the normal direction; consequently, a lens on the backside of high-index substrate collects more light compared with a lens of the same size on the backside of a standard substrate. Since the rays of the light collected by the lens are emitted externally, the high-index lens/substrate further enhances the light output of the OLED.

DETAILED DESCRIPTION

Figure 1:
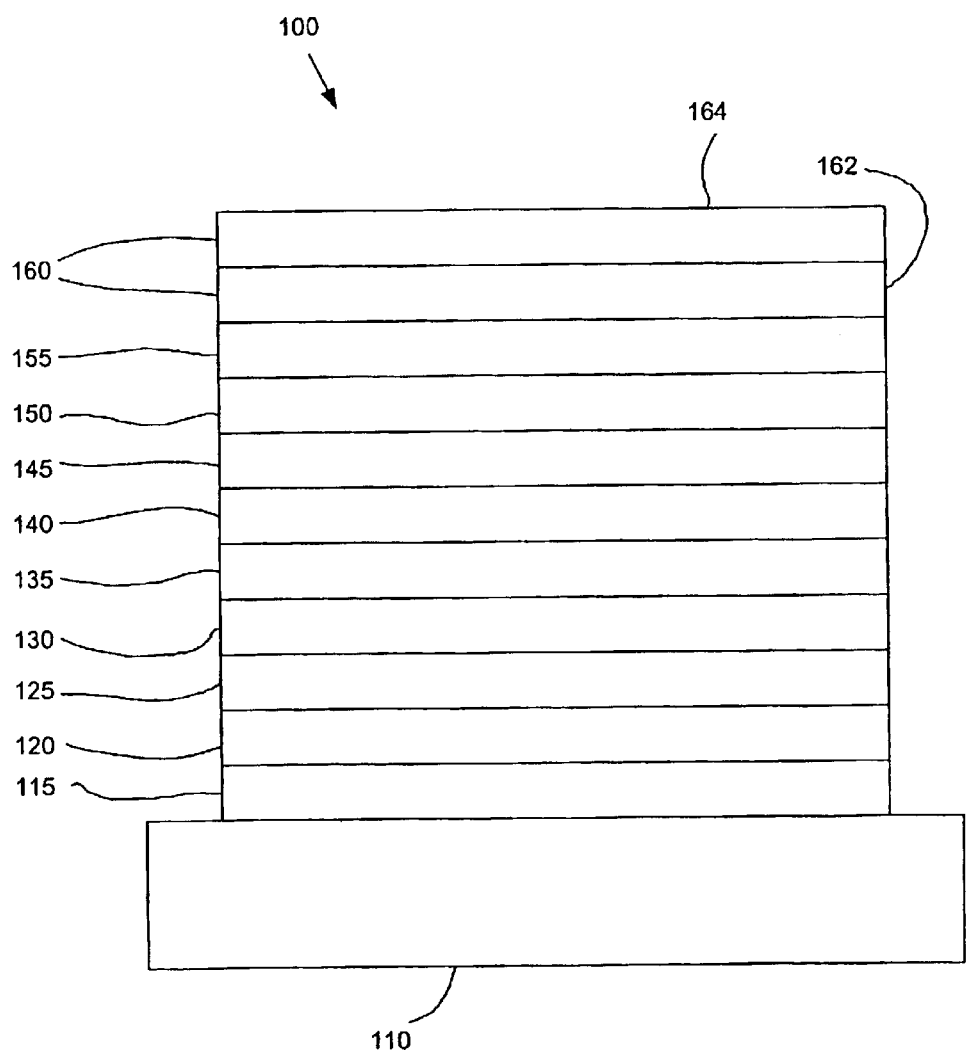
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. The "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Most preferably, the electron affinity of the charge carrying component of the electron transport layer is greater than the work function of the cathode material. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
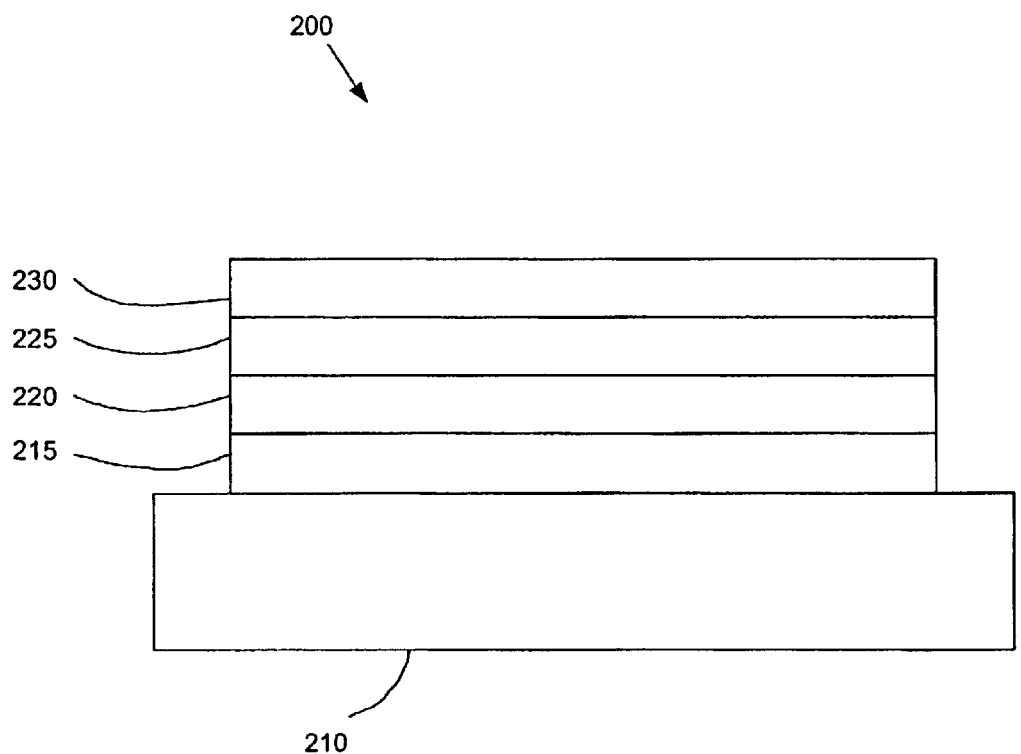
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

As used herein, "solution processible" means capable of being dissolved, dispersed, or transported in and/or deposited from a liquid medium, either in solution or suspension form.

In an embodiment of the invention, the external coupling efficiency (photons externally emitted per photons generated) in planar organic light-emitting devices may be modeled based on a quantum mechanical microvavity theory and measured by examining the edge emission of light trapped in the glass substrate. The external coupling efficiency may be dependent upon the thickness of the indium-tin-oxide layer, and the refractive index of the substrate. Depending upon the device parameters, the coupling efficiencies in planar devices may range from ~24% to ~52%, and from ~36% to ~46%, but in general it is much larger than the 18.9% expected from classical ray optics. By adding non-planar features to the substrate, such as surface roughness, shaped elements such as lenses, including shaped elements having a periodicity the same as or different from the underlying device pixels, much higher coupling efficiencies may be achieved, and the external electroluminescent efficiency (photons externally emitted per electrons in) for efficient phosphorescent devices may be greater than 56%.

There has been an enormous interest in organic light emitting devices (OLEDs) primarily due to its application in flat panel displays. One relevant parameter for OLEDs is the external coupling efficiency, $\eta_{cp,\ ext}$, which is the ratio of photons externally emitted over photons generated. Two other parameters of interest are the internal quantum efficiency, $\eta_{int}$, which is the number of photons generated per electron, and the external quantum efficiency, $\eta_{ext}$, which is the number of photons externally emitted per electron. These parameters are related as follows: $\eta_{ext} = \eta_{cp,\ ext} * \eta_{int}$.

Photons that are generated may be trapped in high index-of-refraction materials of an OLED structure, leading to $\eta_{ext}$~0.20–0.30 for typical structures, leading to correspondingly low power efficiency of the OLED. Substrate patterning that recovers some of the trapped light has been shown to improve the OLED external coupling efficiency, as described in G. Gu, D. Z. Garbuzov, P. E. Burrows, S. Venkatesh, and S. R. Forrest, "High-external-quantum-efficiency organic light-emitting devices", *Opt. Lett.*, vol. 22, pp. 396–398, 1997, and in C. F. Madigan, M.-H. Lu, and J. C. Sturm, "Improvement of output coupling efficiency of organic light-emitting diodes by backside substrate modification", *App. Phys. Lett.*, vol. 76, pp. 1650–1652, 2000, which are incorporated by reference in their entireties.

In one embodiment of the invention, the indices of refraction of the materials comprising an OLED may be selected to increase the amount of light emitted by the OLED. In a further embodiment of the invention, selected indices of refraction may be combined with substrate patterning to dramatically increase the amount of light enmitted by the OLED, and to achieve outcoupling efficiencies not previously attainable with practical OLED structures.

Figure 3:
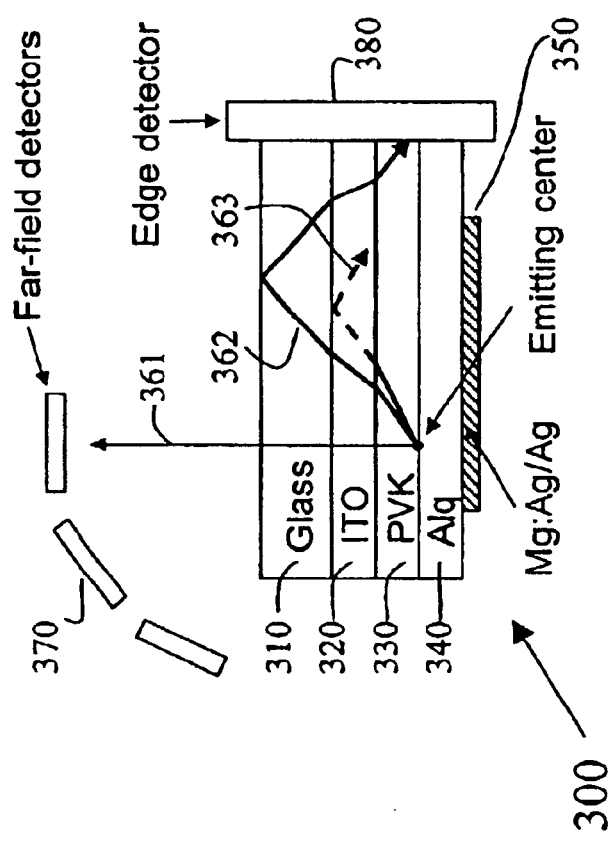
FIG. 3 shows an organic light emitting device and sensors capable of detecting different modes of light emitted by the device.

One typical OLED structure includes a multi-layer sandwich of a planar glass substrate ($n_{glass1}$=1.51), a layer of indium-tin-oxide (ITO) ($n_{ITO}$=1.8–2.0), one or more organic layers ($n_{org}$=1.6–1.8), and a reflecting cathode. The emitted light can be classified into three types of modes: (1) external modes where the light escapes the substrate, (2) substrate-waveguided modes where the light is trapped in the glass substrate by total internal refraction (TIR) at the glass/air interface, and (3) ITO/organic-waveguided modes where the light is trapped by TIR at the ITO/glass interface. FIG. 3 shows an OLED 300 having a glass substrate 310, an ITO anode 320, a PVK hole transport layer 330, an Alq$_3$ emissive layer 340, and an Mg:Ag/Ag cathode 350. Light may be emitted from emissive layer 340. Based on the transport properties of Alq$_3$, it is believed that most emission from emissive layer 340 occurs near the interface between hole transport layer 330 and emissive layer 340. Mode 361 is an example of an external mode, mode 362 is an example of a substrate-waveguided mode, and mode 363 is an example of an ITO/organic-waveguided mode. Far field detectors 370 and edge detector 380 may be used to measure light intensity in various places. According to the classical ray optics theory, the coupling efficiencies of the external, substrate and ITO/organic modes are 18.9%, 34.2%, and 46.9%, respectively. It is believed that some conventional devices may actually have an external coupling efficiency higher than 18.9%. It is possible that some researchers have overestimated internal quantum efficiency by using an estimated external coupling efficiency that was too low. In addition, several groups have reported dependence of the far-field emission pattern on the thickness of the organic layer, which is not explained by the classical theory. Studies on the directionality and spectrum of the external emission have been carried out using wave optics. Also, a half-space radiating dipole model was used to describe the external and substrate modes of a polymer OLED.

A quantum mechanical (QM) microcavity theory has been shown to accurately predict the emission into all three modes as a function of the OLED layered structure. See V. Bulovic, V. B. Khalfin, G. Gu, and P. E. Burrows, D. Z. Garbuzov, and S. R. Forrest, "Weak microcavity effects in organic light-emitting devices", *Phys. Rev. B*, vol. 58, pp. 3730–3740, 1998, M.-H. Lu, C. F. Madigan, and J. C. Sturm, "Experiment and modeling of conversion of substrate-waveguided modes to surface-emitted light by substrate patterning", *Mat. Res. Soc. Proc*, vol. 621, Q3.7, 2000, which are incorporated by reference in their entireties. This QM model may be used to compute the distribution of light among the three modes, and to examine the effects of the thickness of the ITO layer and the index of refraction of the substrate on this distribution. These modeling results may be correlated with experimental evidence.

Figure 4:
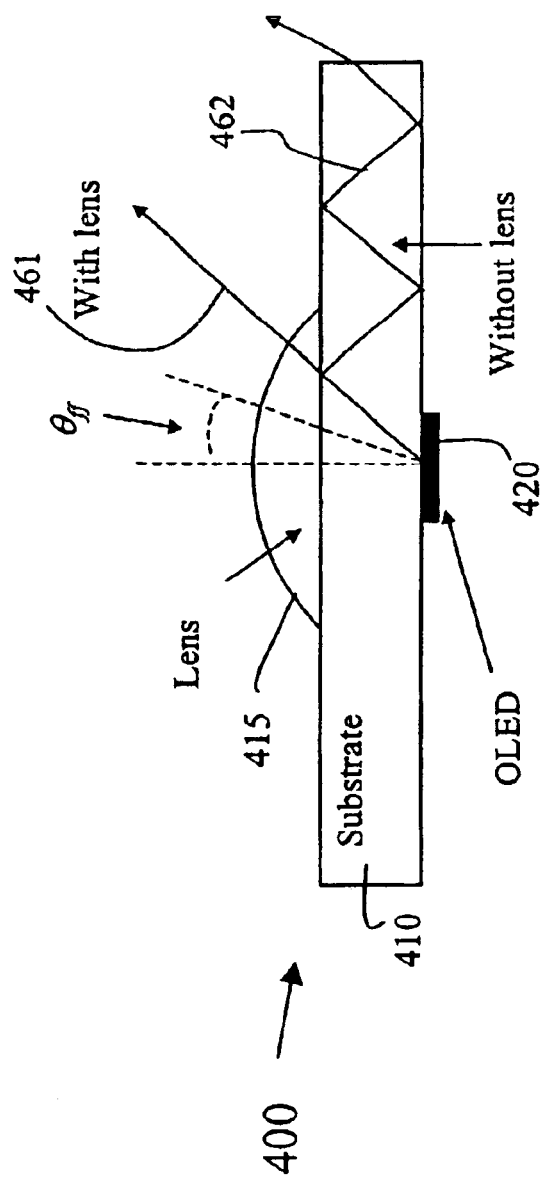
FIG. 4 shows an organic light emitting device having a lens.

By patterning the backside of the glass substrate opposite to the OLED, some light in the substrate-waveguided modes can be made to emit externally, as disclosed in G. Gu, D. Z. Garbuzov, P. E. Burrows, S. Venkatesh, and S. R. Forrest, "High-external-quantum-efficiency organic light-emitting devices", *Opt. Lett.*, vol. 22, pp. 396–398, 1997, T. Yamasaki et al., "Organic Light Emitting Device With an Ordered Monolayer of Silica Microspheres as a Scattering Medium," *App. Phys. Lett.*, vol. 76, pp. 1243–1245 (2000); C. F. Madigan, M.-H. Lu, and J. C. Sturm, "Improvement of output coupling efficiency of organic light-emitting diodes by backside substrate modification", *App. Phys. Lett.*, vol. 76, pp. 1650–1652, 2000, which are incorporated by reference in their entireties. However, the light in the ITO/organic-waveguided modes may not be recoverable by this technique. In one embodiment of the invention, high-index substrates ($n_{glass2}$=1.85>$n_{org}$) may be used to eliminate the ITO/organic modes, thus leaving more light available for conversion into external modes. FIG. 4 shows a device 400 having a substrate 410, a lens 415 attached to the back surface of the substrate, and the other layers 420 of an OLED. Layers 420 may have a structure similar to that shown in FIG. 3, and detectors similar to those illustrated in FIG. 3 may be used. Mode 462 is a substrate-guided mode as it would exist if lens 415 were not present. The presence of lens 415 converts some of mode 462 into an external mode 461. The light emitted into these different modes for different substrates have been calculated and experimentally verified. In the planar OLED of FIG. 3, a large portion of the light is trapped in the substrate and enters the edge detector. After attaching a lens to the backside as in FIG. 4, some light trapped in the substrate is emitted externally. In both cases, the ITO/organic modes are heavily attenuated by the ITO layer.

Since the layers in a typical OLED may be much thinner than the emission wavelength, external coupling of light is poorly described by classical ray optics. The QM theory described above may be used to calculate the distribution of light emission into various modes and to predict the amount of increase in external emission by attaching a lens to the backside of the substrate. In this formulation, the exciton is modeled as a radiating dipole, and the external coupling efficiency is proportional to the transition rate given by Fermi's golden rule:

$$f = \frac{2\pi}{\hbar} \sum_n |\langle m|\mu \cdot E(k,z)|n\rangle|^2 \delta(E_n - E_m - h\nu) \quad (1)$$

where μ is the dipole moment which is assumed to be isotropically distributed, and E(k, z) is the electrical field for mode k at the dipole. $E_m$ and $E_n$ are the energies of the initial and final exciton states. hv is the energy of the photon emitted. The transition rate is obtained by summing over all k and v. The electric field for TE and TM modes at a distance l from the cathode is determined by the microcavity structure:

$$E_k^{TE} = A(k)\sin^2(k_{oz}l)\hat{x} \quad (2)$$

$$E_k^{TM} = B(k)\cos^2\theta_o \sin^2(k_{oz}l)\hat{y} + C(k)\sin^2\theta_o\cos^2(k_{oz}l)\hat{z}$$

where A(k), B(k) and C(k) are functions of material constants and k. $k_{oz}$ is the z component of the wave vector in the emitting layer, and $\theta_o$ is the angle of the wave vector in the emitting layer measured from the normal. For spontaneous emission, the electrical fields are normalized such that the energy in each mode is equal to that of a single photon. The electric fields for TE and TM modes may be calculated using standard microcavity theory assuming the cathode is a perfect reflector, as described in E. Hecht, Optics, 3rd ed., pages 373–376, Addison-Wesley, Reading Mass. (1998), which is incorporated by reference.

Figure 5:
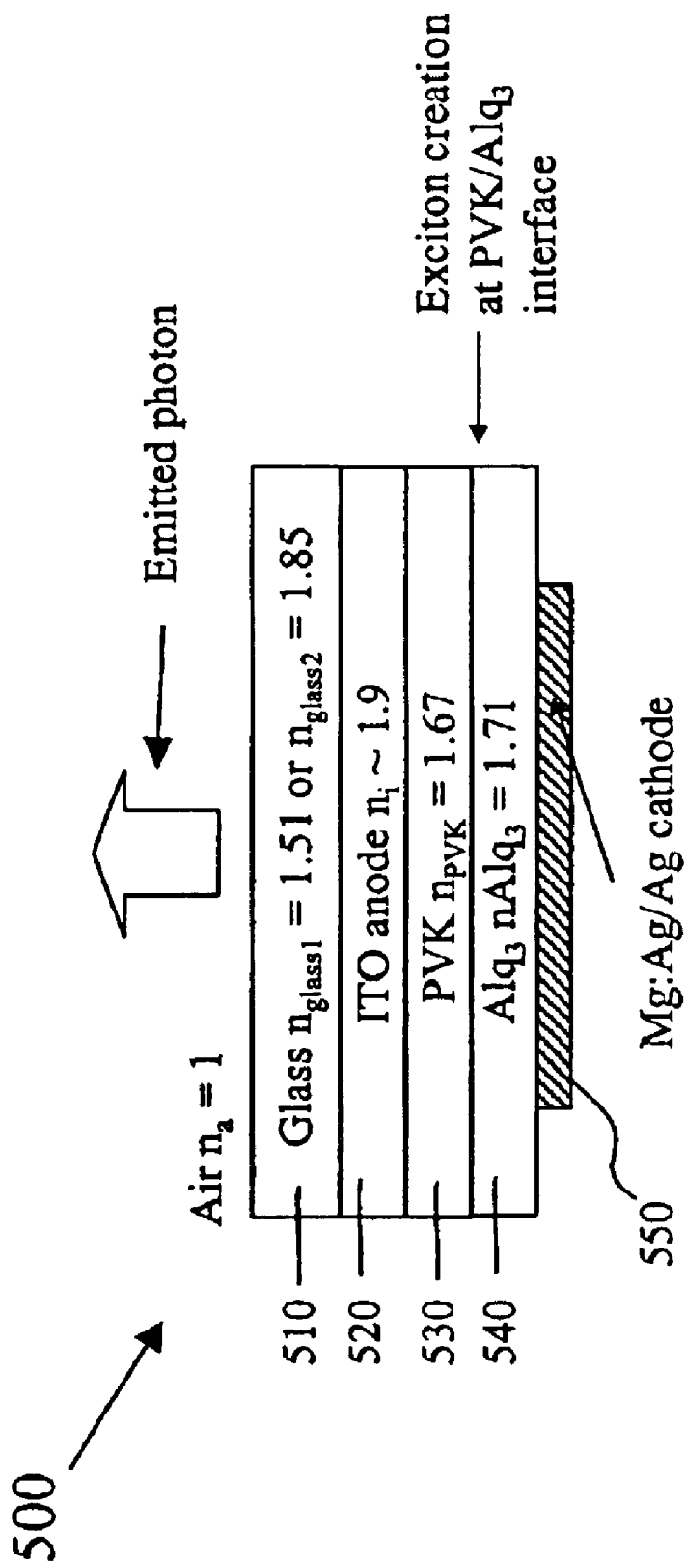
FIG. 5 shows an organic light emitting device structure used to perform calculations.

In an embodiment that does not require a non-planar substrate, FIG. 5 shows a device structure that was used to perform the calculations described by equations 1 and 2. A non-planar substrate is not required but is preferred, due to enhanced outcoupling. Device 500 includes a substrate 510, an ITO anode 520, a PVK hole transport layer 530, an $Alq_3$ emissive layer 540, and a Mg:Ag/Ag cathode 550. Calculations were performed for two different substrates 510, one comprising glass with an index of refraction "n" equal to 1.51, and the other having a higher index of refraction "n" =1.85. The indices of refraction for ITO anode 520, PVK hole transport layer 530 and $Alq_3$ emissive layer 540 were 2.0, 1.67, and 1.71, respectively. The excitons were assumed to be created at the $Alq_3$/PVK interface and diffuse into $Alq_3$ with a characteristic length of 20 nm, consistent with C. W. Tang, S. A. VanSlyke, and C. H. Chen, "Electroluminescence of doped organic thin films", *J. Appl. Phys.*, vol. 65, pp.3610–3616, 1989, which is incorporated by reference. The thickness of the $Alq_3$ layer was varied from 20–80 nm to control the location of emission, and external coupling efficiency may be strongly dependent upon this distance, as described in C. F. Madigan, M.-H. Lu, and J. C. Sturm, "Improvement of output coupling efficiency of organic light-emitting diodes by backside substrate modification", *App. Phys. Lett.*, vol. 76, pp. 1650–1652, 2000, which is incorporated by reference in its entireties. The transition rate into each optical mode was computed by integrating over photon energy and exciton location. Energy transfer to the cathode was approximated with the results given by Bulovic et al.

Figure 6:
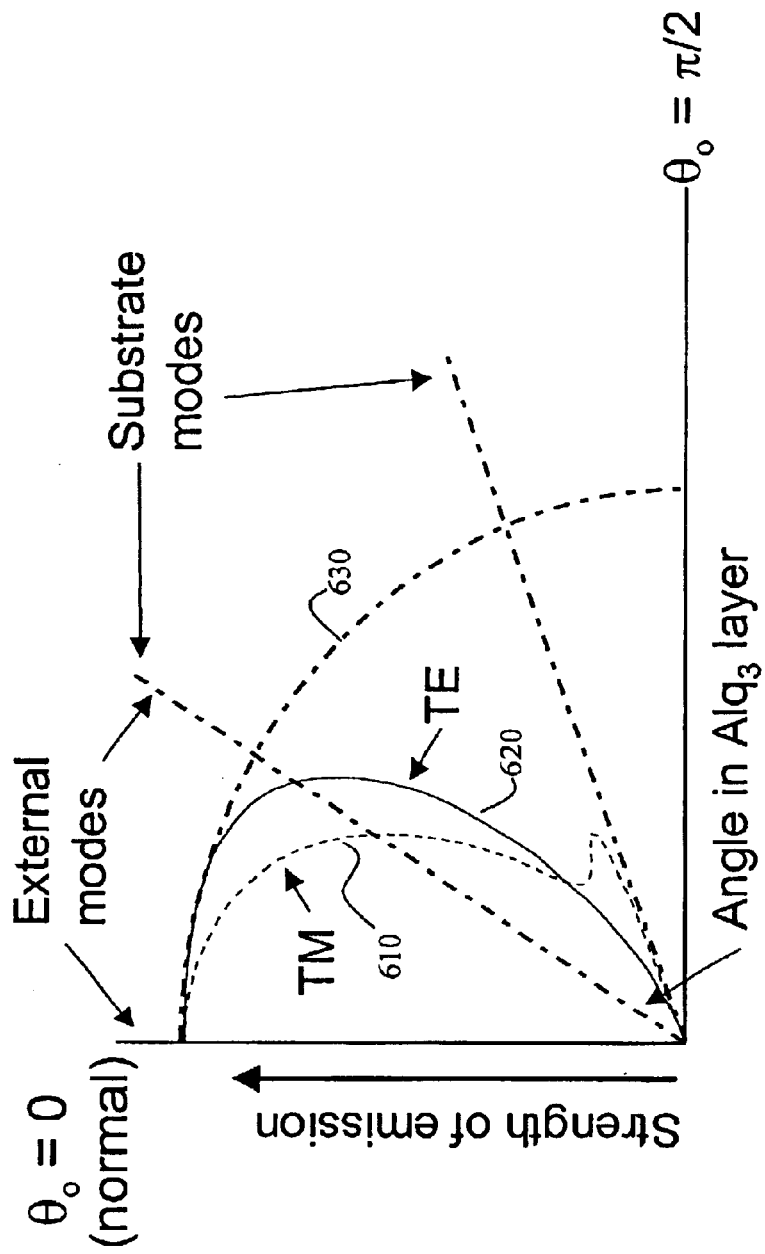
FIG. 6 shows a calculated polar plot of modal strength vs. mode angle.

In one embodiment, the distribution of the emitted light in a bi-layer OLEDs is calculated with the following structure: soda lime glass/100 nm ITO/40 nm PVK/80 nm $Alq_3$. FIG. 6 shows a calculated polar plot of modal strength in $Alq_3$ vs. mode angle in $Alq_3$ for the radiation pattern near the peak of $Alq_3$ spectrum (λ=524 nm) (OLED structure: standard glass/ 100 nm ITO/40 nm PVK/80 nm $Alq_3$/Mg:Ag, the exciton is at the PVK/Alq3 interface). Plots 610 and 620 show calculated QM results for transverse magnetic (TM) and transverse electric (TE) modes, respectively. Because the substrate has a higher index of refraction than the emissive layer, there are no ITO/organic modes. The cut-off wavelength is ~452 nm for TE modes, and ~440 nm for TM modes. Plot 630 shows calculated results for the classical model. The QM microcavity results are in stark contrast to the isotropic radiation of the classical model. The external and substrate modes are a continuum as the distance of observation and the thickness of the glass substrate are much greater than the wavelength in question. Due to microcavities, both TE and TM modes are suppressed compared with the isotropic ray optics model at large angles in the substrate. The combined ITO/organic layer thickness is on the order of a half wavelength, so the modes there, if they exist, are discrete. In this particular example, no ITO/organic mode exists for either TE or TM radiation. In general, the energy in these ITO/organic modes is significant, but still less than what ray optics would predict. The reduced emission at large angles in the substrate and ITO/organic modes constitutes the main difference between the QM and the classical model.

Figure 7:
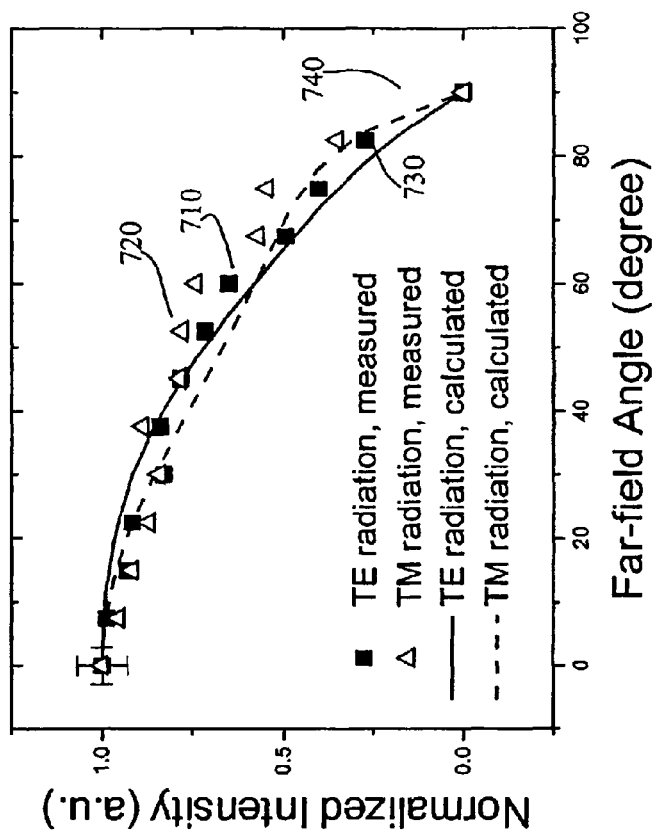
FIG. 7 shows a calculated far-field intensity pattern compared with the experimental data, as plots of normalized intensity v. far field angle.

The flux emitted into each of the three categories of modes is obtained by integrating or summing over the appropriate wave vectors, weighted by the exciton distribution profile and the PL spectrum of $Alq_3$. FIG. 7 shows the calculated far-field intensity pattern compared with the experimental data, as plots of normalized intensity v. far field angle. Data points 710 and 720 show measured intensity for TE and TM radiation, respectively. Typical error bars are shown on the first data point of TE modes (points 710). Lines 730 and 740 show calculated intensity for TE and TM radiation, respectively. Unlike inside the $Alq_3$ (see FIG. 6), the TM modes at large far-field angles in air have slightly higher intensity than the TE modes due to a larger glass to air transmission coefficient for TM modes at large angles. This effect is visible in both the modeling and the data.

Figure 8:
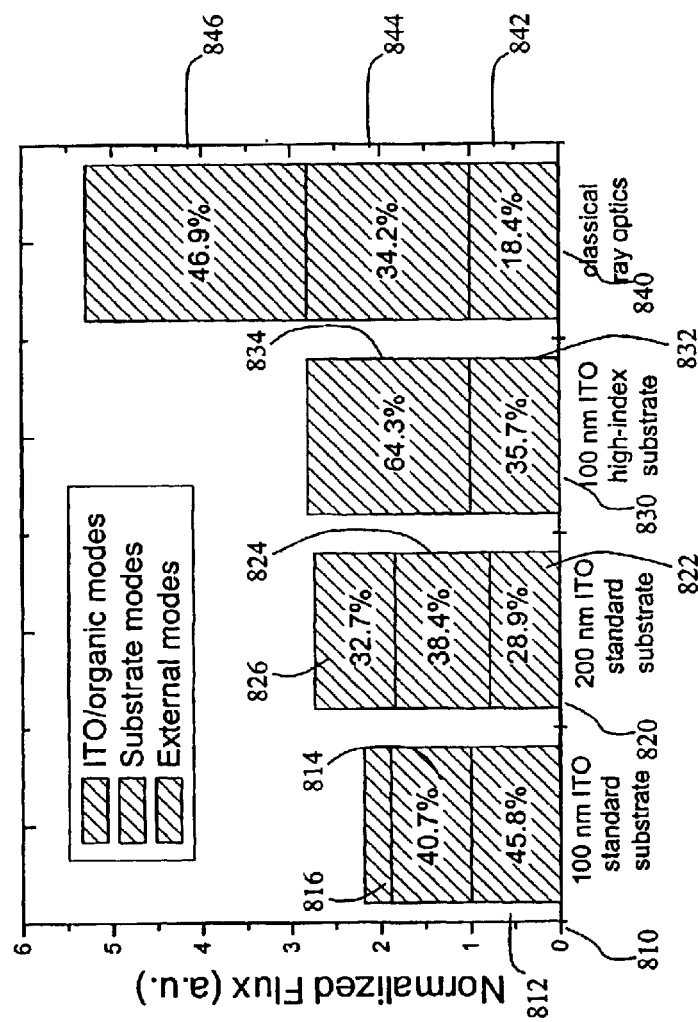
FIG. 8 shows calculated normalized flux for various device structures and substrate materials.

The thickness of the ITO layer affects the modal distribution in two ways. It alters the ITO/organic modes by changing the combined thickness of the ITO/organic layer, and the external and substrate modes through interference effects. It is possible to have an ITO layer so thin that no mode exists for most of the visible spectrum. The distribution of light emission was calculated for OLEDs with 100 nm and 200 nm-thick ITO layers using the QM model (bars 810, 820 and 830) and classical ray optics (bar 840), and the results are shown in FIG. 8. The calculations were performed for the following structure: glass substrate/ITO/40 nm PVK/80 nm Alq3/Mg:Ag. The external emissions are equal for the two devices, as this fraction is not dependent on the index of refraction of the intervening layers. In the device on high index substrates, light is no longer bounded by TIR at the glass/ITO interface and the ITO/organic modes are eliminated, while these modes remain in the device on standard substrates.

FIG. 8 shows normalized flux, in arbitrary units, for various calculations. Bar 810 shows flux for a device having a 100 nm ITO on standard substrate, where the flux is broken into external modes 812, substrate modes 814, and ITO/organic modes 816. Bar 820 shows flux for a device having a 200 nm ITO on standard substrate, where the flux is broken into external modes 822, substrate modes 824, and ITO/organic modes 826. Bar 830 shows flux for a device having a 100 nm ITO on high index substrate, where the flux is broken into external modes 832 and substrate modes 834. Each of bars 810, 820 and 830 were calculated using the QM model. Bar 840 shows flux for a device calculated using classical ray optics, where the flux is broken into external modes 842, substrate modes 844, and ITO/organic modes 846. Bars 810, 830 and 840 have the external normalized to 1. A different normalization was applied to bar 820.

Absorption of the ITO/organic modes in the device having a 100 nm ITO electrode on a standard substrate (bar 810) prevents bar 810 from having the same total height as bar 830; but for such absorption, bars 810 and 830 would have the same total height. The device corresponding to bar 830 does not have such absorbtion, because there are no ITO/organic modes. Since the thickness of the ITO and organic layers is much less than the wavelength in question, QM effects dominate such that the emission into the ITO/organic modes depends significantly on the number of the modes. In many embodiments of the invention, there are at most one TE and one TM mode in the range of the visible wavelengths; therefore, emission into the ITO/organic modes is suppressed. If the ITO and organic layers were thick enough so that the classical limit applies, the total emission would have been equal irrespective of the substrate.

The emission into the ITO/organic modes in the OLED with the thinner ITO layer is drastically suppressed, since the cut-off wavelength is only slightly above the low end of the visible spectrum. On the other hand, the cut-off is above the peak emission wavelength of $Alq_3$ in the OLED with the 200 nm ITO layer, resulting in much stronger ITO/organic modes. The absolute value of the emission into the external and substrate modes is moderately affected by the interference effects, not enough to prevent the proportion of external emission from increasing with decreasing ITO layer thickness. Depending upon the parameters used, theoretically, as much as ~52% or ~46% of the light could be emitted externally in the planar device with 100 nm ITO.

On standard soda lime glass substrates, the confinement of the ITO/organic modes hinges on the fact that the glass substrate has a lower index of refraction than that of the emitting layer, so that some light is trapped by total internal refraction (TIR) at the ITO/glass interface. A high-index-of-refraction substrate completely eliminates the TIR, subsequently converts the ITO/organic modes into substrate modes. 17, 18 This effect is illustrated in FIG. 8 where the distribution is again calculated for identical devices on standard and high-index glass substrates. There is no change in the far-field intensity pattern, as it is not dependent upon the index of the intervening layers. But the total rate of emission is different because all modes in the OLED on high-index substrates are continuum modes. In the short wavelength length limit, the total emission would have been the same. This extra emission into the substrate modes is most relevant to backside patterning techniques where the substrate modes are made to emit externally, as disclosed in T. Yamasaki et al., "Organic Light Emitting Device With an Ordered Monolayer of Silica Microspheres as a Scattering Medium," App. Phys. Lett., vol. 76, pp. 1243–1245 (2000); M.-H. Lu, C. F. Madigan, and J. C. Sturm, IEDM 2000 Tech. Dig., 607 (2000), which are incorporated by reference in their entireties.

Figure 9:
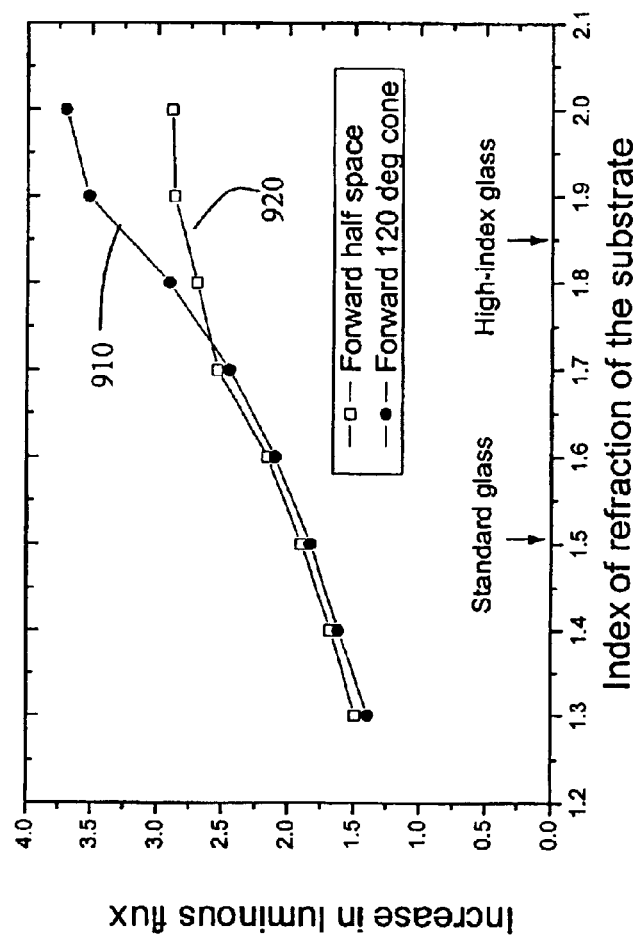
FIG. 9 shows calculated increase in luminous flux as a function of substrate index of refraction.

As illustrated in FIG. 8, the use of a substrate having an index of refraction higher than that of the emissive layers may result in a dramatic increase in the amount of light in substrate modes. Substrate patterning may be used to converts light trapped in the substrate modes into externally emitted light. Consequently, increased emission into substrate modes in OLEDs on high-index substrates allows more light to be harvested via substrate patterning. The increase in the external luminous flux that would be expected from attaching a lens with the same index as the substrate was calculated, assuming a lens large enough that all light previously trapped in the substrate can be emitted externally. FIG. 9 shows the result of these calculations. Plot 910 shows the increase in luminous flux in a forward 120 degree cone. Plot 920 shows the increase in luminous flux in the forward half space. The predicted enhancement factor increases monotonically with the index of refraction of the substrate. As the index of the substrate increases beyond that of the emitting layer ($n_{Alq3}$=1.71), emission becomes more concentrated in the forward direction due to refraction. Hence there is a larger factor of increase for the luminous flux in the forward 120° cone compared with that in the entire forward half space for higher substrate indices.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4''-tris(3-methylphenylphenlyamino)triphenylamine |
| Alq$_3$: | 8-tris-hydroxyquinoline aluminum |
| Bphen: | 4,7-diphenyl-1,10-phenanthroline |
| n-BPhen: | n-doped BPhen (doped with lithium) |
| F$_4$-TCNQ: | tetrafluoro-tetracyano-quinodimethane |
| p-MTDATA: | p-doped m-MTDATA (doped with F$_4$-TCNQ) |
| Ir(ppy)$_3$: | tris(2-phenylpyridine)-iridium |
| Ir(ppz)$_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | naphthyl-phenyl-diamine |
| TPD: | N,N'-bis(3-methylphenyl)-N,N'-bis-(phenyl)-benzidine |
| BAlq: | aluminum(III)bis(2-methyl-8-quinolinato) 4-phenylphenolate |
| mCP: | 1,3-N,N-dicarbazole-benzene |
| DCM: | 4-(dicyanoethylene)-6-(4-dimethylaminostyryl-2-methyl)- 4H-pyran |
| DMQA: | N,N'-dimethylquinacridone |
| PEDOT:PSS: | an aqueous dispersion of poly(3,4-ethylenedioxythiophene) with polystyrenesulfonate (PSS) |

Experimental:

Specific representative embodiments of the invention will now be described, including how such embodiments may be made. It is understood that the specific methods, materials, conditions, process parameters, apparatus and the like do not necessarily limit the scope of the invention.

Bi-layer OLEDs were fabricated on 0.5 mm-thick soda lime ($n_{glass1}$=1.51) glass and high-index glass (Schott SFL57, $n_{glass2}$=1.85) substrates. Indium-tin-oxide (ITO, $n_{ITO}$=2.0) layers, 100 nm or 200 nm in thickness were deposited by RF magnetron sputtering with no intentional heating. The sheet resistance of the 100-nm-thick ITO was approximately 100 Ω/sq, and the transmission was ~80% in the visible. The hole transport layer in all devices was a 40 nm layer of PVK ($n_{PVK}$=1.67), deposited by spin-coating after the ITO surface was treated by an O$_2$ plasma as described in C. -C. Wu, C. -I. Wu, J. C. Sturm, and A. Khan, "Surface modification of indium tin oxide by plasma treatment: an effective method to improve the efficiency, brightness and reliability of organic light emitting devices," *Appl. Phys. Lett.*, vol. 70, pp. 1348–1350, 1997, which is incorporated by reference in its entirety. The electron transport and emitting layer in all devices was Alq$_3$ (nAlq=1.71), deposited by vacuum sublimation. The cathodes were 30 nm of Mg:Ag (10:1) followed by an Ag cap evaporated through a shadow mask with 0.5 mm-diameter holes. The EL spectrum showed that light emission was exclusively from the Alq$_3$ layer. All lenses used for effective substrate-shaping have a radius of curvature of 2.0 mm and a height of 1.5 mm, placing the OLED at the center of the curvature. Index matching oil ($n_{oil1}$=1.51) and gem refractometer liquid ($n_{oil2}$=1.81, both from R. P. Cargille Lab. Inc.) were used to match the lenses to their respective substrates. The far-field emission pattern was measured by a Si photo-detector with a linear polarizer.

Direct measurement of the substrate and ITO/organic waveguided light may be difficult; therefore, a method was devised that measures indirectly the ratio of light emission into the external modes over that into the substrate modes, i.e., $\eta_{cp,ext}/\eta_{cp,sub}$. A portion of substrate waveguided light may be made to emit externally by attaching a lens to the backside of the substrate. Due to the thickness of the substrate, it was assumed that attaching the lens negligibly affected the behavior of the OLED. Since the ITO/organic modes were heavily attenuated by absorption in the ITO layer, it was assumed that the edge emission was exclusively from the substrate modes. Further, assuming the absence of scattering that mixes the modes, it follows that:

$$F_{ext} + F_{sub} = F'_{ext} + F'_{sub} = r_1 F_{ext} + r_2 F_{sub}$$

$$\frac{\eta_{cp,ext}}{\eta_{cp,sub}} = \frac{F_{ext}}{F_{sub}} = \frac{1 - r_2}{r_1 - 1}$$

where $F_{ext}$ and $F_{sub}$ are the fluxes in the external and substrate modes in a planar sample, and the primed symbols are the fluxes after lens attachment. $r_1$ and $r_2$ are defined as $F'_{ext}/F_{ext}$ and $F'_{sub}/F_{sub}$, respectively.

The measured ratios of $\eta_{cp,ext}/\eta_{cp,sub}$ for various devices are summarized in Table 1, and are compared to calculations based on the QM microcavity model for different structures. The thicknesses of the PVK and Alq$_3$ layers were 40 nm and 80 nm, respectively. There was reasonable agreement between the measured and calculated values despite the simplicity of some assumptions, such as the absence of mode-mixing scattering. The data confirmed the reduction of emission into the external modes relative to the substrate modes as the ITO thickness was increased, and when high index subtrates were used.

TABLE 1

| Sample | Measured | QM Model |
|---|---|---|
| Soda lime glass/100 nm ITO/PVK/Alq3/Mg:Ag/Ag | 1.30 ± 0.20 | 1.12 |
| Soda lime glass/200 nm ITO/PVK/Alq3/Mg:Ag/Ag | 0.51 ± 0.08 | 0.75 |
| High-index glass/100 nm ITO/PVK/Alq3/Mg:Ag/Ag | 0.41 ± 0.06 | 0.56 |

A QM microcavity model was used to calculate the detailed distribution of light emission in planar OLEDs. The emission into the external modes were found to be as high as ~52%, much higher than the 18.9% predicted by ray optics. This suggests that the high external quantum efficiency in some efficient devices does not invalidate the basic assumptions about spin statistics. Experimental measurement of the ratio, $\eta_{cp,ext}/\eta_{cp,sub}$, qualitatively agrees with the model. The main difference between the classical and QM models arises from the relative suppression of modes at high angles from the normal by the microcavity effect.

In one embodiment of the invention, high-index-of-refraction substrates are shown theoretically and experimentally to increase the external coupling efficiency of organic light-emitting devices (OLEDs) by using a quantum mechanical microcavity model. This increase may be due to the elimination of those modes waveguided in the ITO/organic layer. Bi-layer OLEDs were fabricated on standard soda lime glass and high-index glass substrates, and their far-field intensity pattern was measured. Among the devices optimized for external efficiency, those on shaped high-index substrates exhibited a 53% improvement in external quantum efficiency over the devices on shaped standard glass substrates, and an increase by a factor of 2–3 times over those on planar glass substrates. This principle is applicable to any backside patterning technique in conjunction with other OLED structural improvements.

Figure 10:
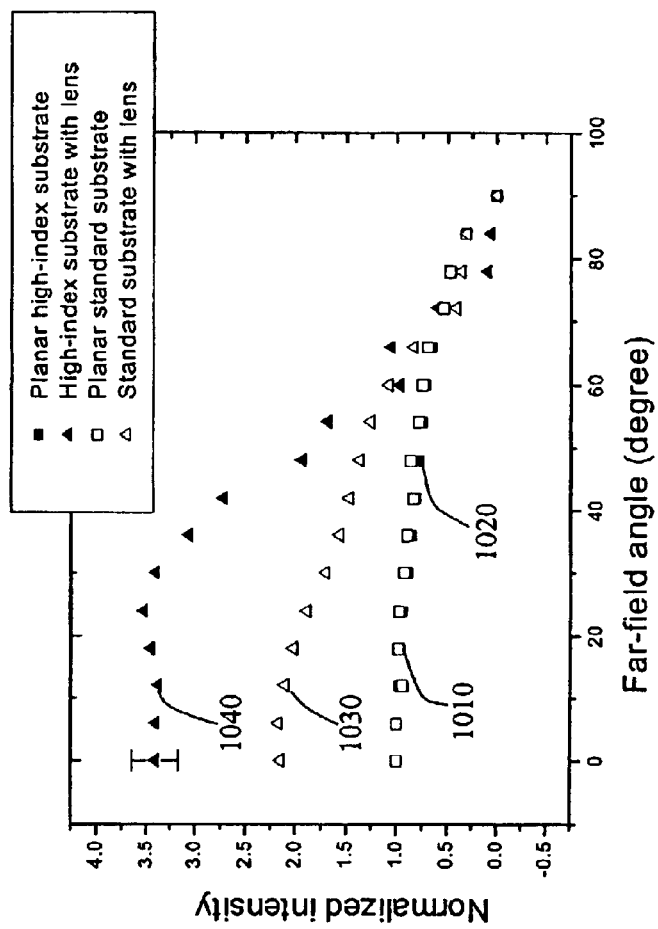
FIG. 10 shows measured far-field intensity patterns for various OLEDs.

FIG. 10 shows measured far-field intensity patterns of OLEDs having the following structure: ITO/PVK/80 nm Alq$_3$/Mg:Ag/Ag. Measurements were performed on devices having standard and high-index substrates, with and without a lens attached. Plots 1010, 1020, 1030 and 1040 show measurements for standard substrate, no lens (1010), high index substrate, no lens (1020), standard substrate with lens (1030), and high index substrate with lens (1040), respectively. As expected, in devices fabricated on planar substrates, the far-field intensity patterns are the same, irrespective of the index of the substrates. Once a lens of the same index as the substrate is attached, the devices on the high-index substrates showed an average increase by a factor of 3.2 in the intensity in the normal direction versus an average increase by a factor of 2.2 for the devices on the standard substrates. These results are very close to the ideal scenario where the OLED is a point source at the center of curvature of the lens where the expected increase is given by $n_{glass}^2$, i.e., by factors of 3.4 and 2.3 for high-index and standard glass substrates respectively.

When the far-field intensity was integrated to give the total external luminous flux, OLEDs on shaped high-index glass substrates showed significantly larger increases than those on standard glass substrates for all thicknesses of Alq$_3$ layers examined (20–80 nm). Due to microcavity effects, the far-field intensity pattern is not Lambertian. In devices with emission zones close to the cathode (i.e., with a thin Alq$_3$ layer), in-plane (large mode angle) TM radiation is enhanced with respect to radiation along the normal direction (5). As a result, a larger fraction of light emission suffers from TIR at the glass/air interface and becomes trapped in the substrate. Consequently, a larger increase in externally emitted light is expected by the substrate mode conversion technique in devices with thinner Alq$_3$ layers. This is confirmed by the measured data. The largest such increase observed was in a 20 nm Alq$_3$ device on high-index substrate, where the external quantum efficiency was increased by a factor of 2.7, versus an increase of 2.2 times for the corresponding device on standard substrates. In OLEDs whose initial quantum efficiencies were optimized by employing a 80 nm Alq$_3$ layer, shaped high-index substrates increased the external quantum efficiency by a factor of 2.3 versus 1.5 for the corresponding device on standard substrates. Table 2 shows a summary of increases in luminous flux for OLEDs on standard and high-index substrates after attaching a lens to the backside of the substrate.

TABLE 2

|  | Standard glass | | High-index glass | |
| --- | --- | --- | --- | --- |
|  | Theo. | Expt. | Theo. | Expt. |
| Q.E. for planar device | N/A | 0.35% | N/A | 0.36% |
| Flux increase in forward half-space | 1.82X | 1.5X | 2.62X | 2.3X |
| Flux increase in forward 120° cone | 1.82X | 1.7X | 3.20X | 2.9X |

For the planar devices, the quantum efficiency (external photon/electron) is the same for devices with standard glass and high index glass substrates, as measured from a group of large-area planar OLEDs.

High-index substrates not only eliminate the ITO/organic modes, but also have a focusing effect on the distribution of emitted light rays. With a large substrate index ($n_{glass2}$= 1.85), diffraction from the emitting layer ($n_{Alq3}$=1.71) bends light rays forward in the substrate. In the ideal scenario where the OLED is a point source at the center of curvature of the lens, the far-field intensity pattern in air is identical to the ray distribution in the substrate, so the emission in air is also more concentrated in the normal direction. Thus, looking at the light emission in the forward 120 degree cone, where most of the viewing takes place, the amount of increase in external quantum efficiency is even more remarkable. The observed maximum increase was by a factor of 3.2 for a 20 nm Alq$_3$ OLED, and a factor of 2.9 for an 80 nm Alq$_3$ OLED, compared with factors of 2.6 and 1.7 for corresponding devices on standard substrates (Table 1). The discrepancy between theoretical and experimental values can be attributed to the finite size of the OLEDs and the imperfections at the edge of the lenses.

Above, it was calculated that the external emission amounts to 35.7% of total emission in the OLED on high-index substrates (see FIG. 8), which is much larger than the ~20% commonly assumed. To verify this result, the reduction in the substrate-waveguided light was correlated with the increase in external emission after the lens was added. This was accomplished by measuring the normal and edge emission simultaneously. Because the ITO/organic modes may be heavily attenuated by the electrodes, it was assumed that the edge emission consists of the substrate-waveguided light exclusively. Further, the total emission rate is assumed to be unchanged from the attachment of a lens on the backside of the substrate. This is reasonable given that the thickness of the substrate, 0.5 mm, was much larger than the wavelength in question. The ratio of emission into the external modes over that into the substrate modes can be calculated from the change in the external and edge emission before and after adding a lens as disclosed in "Experiment and modeling of conversion of substrate-waveguided modes to surface-emitted light by substrate patterning", *Mat. Res. Soc. Proc*, vol. 621, Q3.7, 2000, which is incorporated by reference in its entirety. For an OLED with 80 nm Alq$_3$ on high-index substrate, the data implied an external modes/substrate modes ratio of 0.40±0.08, whereas the ratio in a corresponding device on standard substrate was found to be 1.30±0.30. From the calculations presented in FIG. 8 it is expected that this ratio will be 0.56 and 1.12 for devices on high-index and standard substrates respectively, so the agreement between theory and experiment is very good considering the degree of error associated with the measurement.

Figure 11:
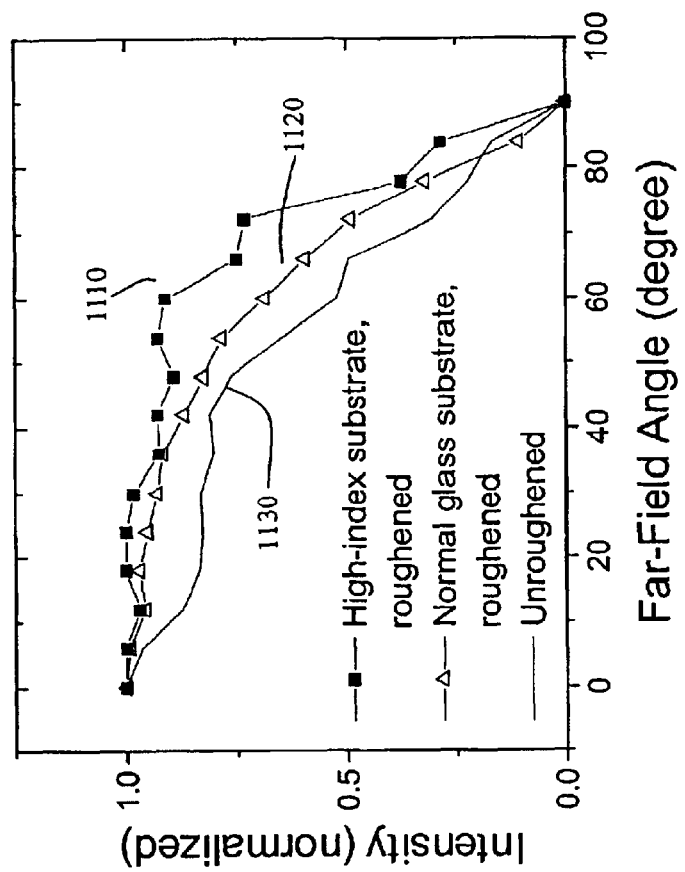
FIG. 11 shows measured far-field intensity profiles for various OLEDs, including OLEDs having a roughened backside.

Increased light emission into the substrate modes can be further demonstrated by a more practical substrate modification technique. When OLEDs were fabricated on substrates whose backsides were roughened by abrasion (resulting RMS roughness=75 nm in both cases as measured by a profilometer). Light in the substrate modes was partially scattered forward. FIG. 11 shows the far-field intensity profile of the resulting OLEDs. Plots 1110, 1120 and 1130 show normalized intensity profiles for devices having a roughened high index substrate, a standard roughened glass substrate, and a standard unroughened glass substrate, respectively. The OLED on the high-index substrate exhibited a 39% increase in total external emission compared with a 17% increase for the OLED on the standard substrate. Roughening the backside does not change the intensity in the normal direction.

It has been demonstrated both theoretically and experimentally that shaped high index of refraction substrates enhances external coupling efficiency by eliminating ITO/organic waveguided modes and redirecting them externally. Using this process, a 2-3-fold increase in the external quantum efficiency of the OLED can be achieved.

Figure 12:
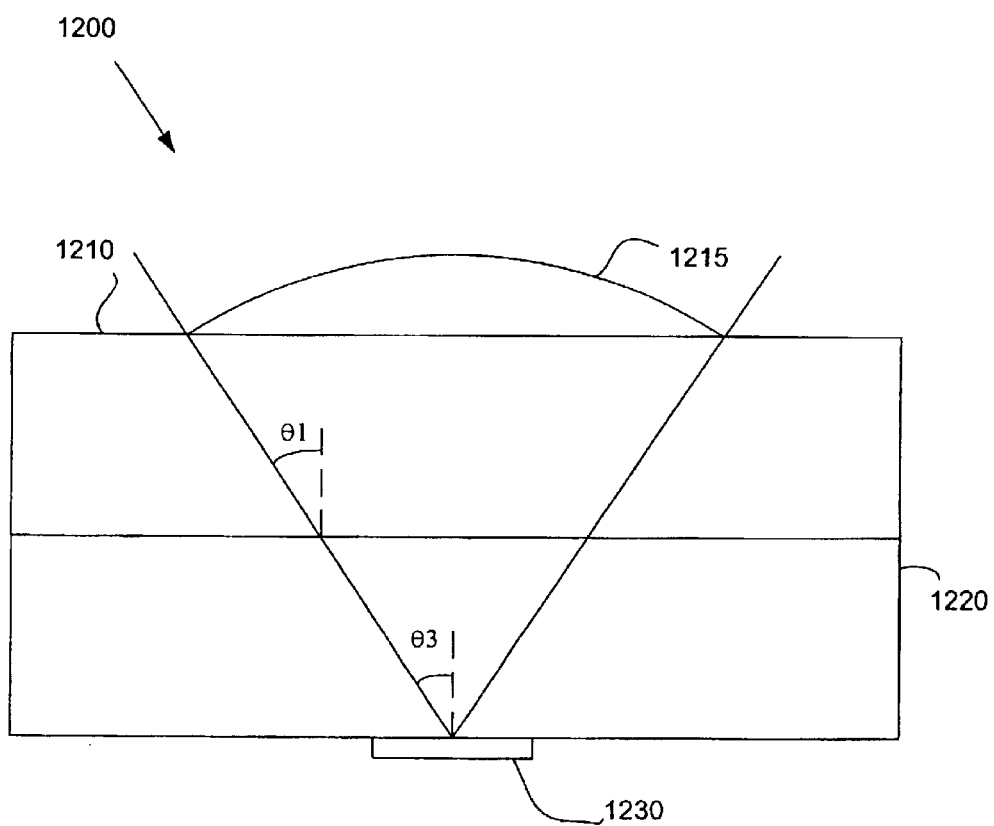
FIG. 12 shows an OLED having a lens and a substrate having a low index of refraction.
Figure 13:
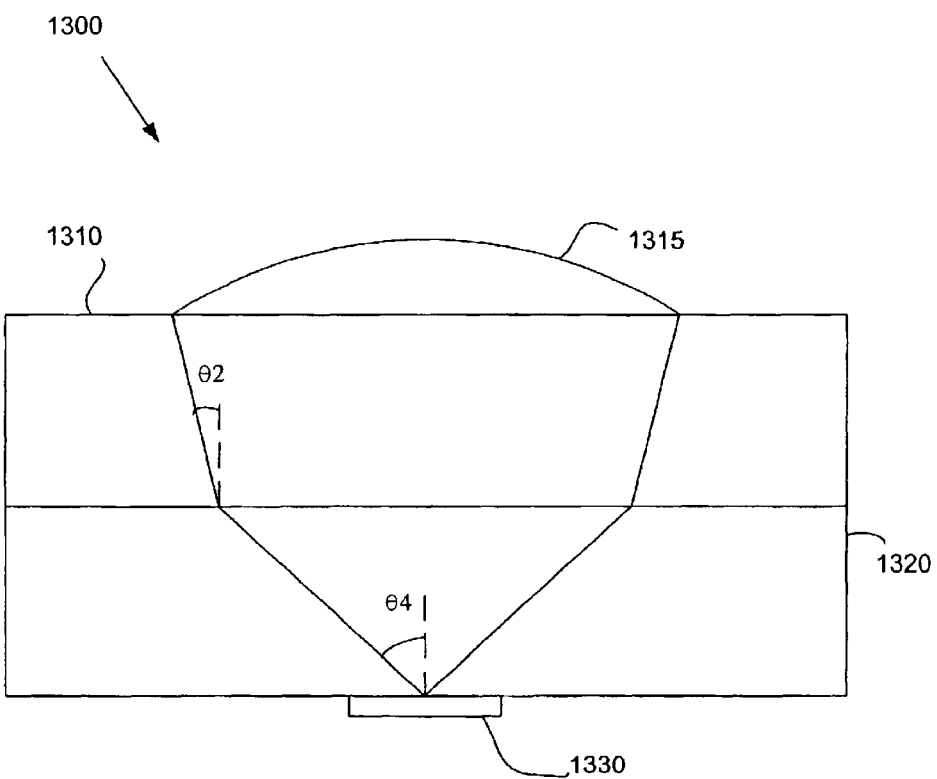
FIG. 13 shows an OLED having a lens and a substrate having a high index of refraction.

FIGS. 12 and 13 illustrate one way in which a high index of refraction substrate increases the amount of light that may be gathered by a lens. FIG. 12 shows a device 1200 having a standard glass substrate 1210, organic/ITO layers 1220, and other layers 1230, such that emission occurs at or near the interface between layers 1220 and 1230. FIG. 13 shows a device 1300 having a high index glass substrate 1310, organic/ITO layers 1320 and other layers 1330, such that emission occurs at or near the interface between layers 1320 and 1330. If layers 1220 and 1320 have the same index of refraction, but substrate 1310 has a higher index of refraction than substrate 1201, the difference in the indices of refraction between layers 1320 and 1310 is greater than the difference between layers 1220 and 1210. As a result, light incident upon the interface between layers 1320 and 1310 will experience a greater decrease in angle θ than light incident upon the interface between layers 1220 and 1210. Due to this greater decrease in θ, θ4 (FIG. 13) may be greater than θ3 (FIG. 12). The result is that more light may be gathered by lens 1330 than lens 1230, as illustrated in FIGS. 12 and 13. FIGS. 12 and 13 illustrate a principle, and the device structures are very simplified.

FIG. 3 may be used to illustrate why waveguiding in an ITO layer is not expected to be problematic. ITO has an index of refraction of about 1.8–2.0, which is higher than both standard small molecule materials (n=1.6–1.8), and small molecule materials having their index of refraction deliberately lowered (n<1.6). As a result, light incident upon an ITO layer from an organic layer generally passes into the ITO layer, and is not reflected back or waveguided into the organic layer. At the same time, the angle between the direction of the light and the normal axis is decreased, as illustrated, for example, by the steeper path of modes 361, 362 and 363 in ITO layer 320, as compared to organic layers 330 and 340. The angle of the light is determined by Snell's law:

$$n_1 \sin(\theta_1) = n_2 \sin(\theta_2)$$

Due to this steeper angle, the light will generally be able to pass from ITO layer 320 into substrate 310, provided that the index of refraction of substrate 310 is not too much lower than that of ITO—and in general, most substrates do not have an index of refraction that is too low. However, the angle of the light becomes less steep in substrate 310 if it has a lower index of refraction than ITO layer 320. In addition, the next interface encountered by the light is an intreface between the substrate and air (n=1.0). Due to the decreased angle of the light, and the very low index of refraction of air, it is expected than there may be significant waveguiding in the substrate, much more significant than waveguiding in the ITO. Such waveguiding may be mitigated by using a non-planar substrate surface, as described herein.

It has been generally described how it is desirable to use a substrate having a higher index of refraction than the organic emissive layer of an OLED. In one embodiment, this relationship is obtained by using substrates having a higher than usual index of refraction. In another embodiment, the relationship may be obtained by using an organic emissive layer having a lower than usual index of refraction. The index of refraction of an organic emissive layer may be lowered in a number of ways. For polymer-based emissive layers, using a particular backbone polymer or particular pendant groups may achieve the desired index of refraction. For small molecule materials, lowering the index of refraction may be achieved in different ways. For example, a bulky substituent may be attached to a host molecule in the emissive layer. A bulky substituent may also be attached to an emissive molecule in the emissive layer, preferably when the emissive layer is a neat film of emissive material. A bulky molecule may also be used as a dopant in the emissive layer. Where the emissive layer is solution processed, bulky substituents may be preferred over bulky dopants, because dopants may separate whereas substituents may not separate. Without intending to be limited as to how the index of refraction is lowered, the basic goal of using a bulky substituent or molecule in the emissive layer is to decrease index of refraction, for example by decreasing the packing density of the materials in the layer and/or by introducing small cavities. Examples of materials that may be used as dopants and/or substituents for the purpose of lowering the index of refraction may be found in K. J. Shea and D. A. Loy, "Bridged polysilsesquioxanes: molecular engineering of hybrid organic-inorganic materials", MRS Bulletin 26, 368–375 (2001); P. Amrhein, A. Shivanyuk, D. W. Johnson, and J. Rebek, Jr., "Metal-switching and self-inclusion of functional cavitands", J. Am. Chem. Soc. 124, 10349–10358 (2002); T. Konishi, A. Ikeda, T. Kishida, B. S. Rasmussen, M. Fujitsuka, O. Ito, and S. Shinkai, "Photoinduced electron transfer between C60-penant calixarene and captured electron donor: improvement of electron-transfer efficiency by applying host-guest chemistry", J. Phys. Chem. A 106, 10254–10260 (2002); F. Cacialli, J. S. Wilson, J. J. Michels, C. Daniel, C. Silva, R. H. Friend, N. Severin, P. Samori, J. P. Rabe, M. J. O'Connel, P. N. Taylor and H. L. Anderson, "Cyclodextrin-treaded conjugated polyrotaxanes as insulated molecular wires with reduced interstrand interactions", Nature Materials 1, 160–164 (2002); K. K. S. Lau, J. A. Caulfield, K. K. Gleason, "Variable angle spectroscopic ellipsometry of fluorocarbon films from hot filament chemical vapor deposition", J. Vac. Sci. Technol. A 18, 2404–2411 (2000); and H. Y. Jeong, Y. K. Lee, A. Talaie, K. M. Kim, Y. D. Kwon, Y. R. Jang, K. H. Yoo, D. J. Choo, and J. Jang, "Synthesis and characterization of the first adamantane-based poly(p-phenylenevinylene) derivative: an intelligent plastic for smart electronic displays", Thin Solid Films 417, 171–174 (2002), which are incorporated by reference in their entireties. The bulky substituent or molecule preferably has a non-planar structure, as described in the references listed above. Preferably, the bulky substituent prevents the organic materials from stacking tightly, and preferably introduces small cavities into the structure to decrease density.

Based on the calculations and experiments described herein, it is believed that an external electroluminescent efficiency of 56% or greater may be achieved by using efficient emissive materials and a non-planar substrate having an index of refraction greater than that of the emissive layer. It is further believed that such a high efficiency has not previously been possible in practical devices having an ITO thickness of at least 120 nm and a thickness of all organic layers of at least 140 nm. It may have previously been possible to achieve very high efficiencies by using thinner ITO or organics, but such devices are expected to have serious reliability and/or performance problems due to the thin ITO and/or organic layers.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device, comprising:
    (a) a substrate having a first index of refraction;
    (b) a first electrode disposed over the substrate;
    (c) an organic emissive layer disposed over the first electrode, the organic emissive layer comprising a small molecule organic material, the organic emissive layer having a second index of refraction; and (d) a second electrode disposed over the organic emissive layer;

(e) wherein the first index of refraction is higher than the second index of refraction; and (f) further comprising a lens disposed on a side of the substrate opposite to the first electrode.

2. The device of claim 1, wherein the first index of refraction is at least 0.14 greater than the second index of refraction.

3. The device of claim 1, wherein the lens has a third index of refraction, and wherein the difference between the first index of refraction and the third index of refraction is less than 0.1.

4. The device of claim 1, wherein the lens and the substrate are made of the same material and have the same index of refraction.

5. The device of claim 1, wherein the first index of refraction is at least 1.85.

6. The device of claim 1, wherein the second index of refraction is at least 1.8.

7. The device of claim 1, wherein the device further comprises one or more additional organic layers disposed between the first electrode and the second electrode.

8. The device of claim 1, wherein the coupling efficiency is 36% or greater.

9. The device of claim 1, wherein the small molecule organic material includes a bulky substituent.

10. An organic light emitting device, comprising:

a substrate;

a first electrode disposed over the substrate, the first electrode having a thickness of at least 120 nm;

an organic emissive layer disposed over the first electrode, the organic emissive layer comprising a small molecule organic material including a bulky substituent; and a second electrode disposed over the organic emissive layer;

wherein all of the organic layers in the device have a combined thickness of at least 140 nm; and wherein the device has an external electroluminescent efficiency of at least 56%.

11. A device, comprising:

(a) a substrate having a first index of refraction, the first index of refraction being at most 1.51;

(b) a first electrode disposed over the substrate (c) an organic emissive layer disposed over the first electrode, the organic emissive layer comprising a small molecule organic material, the organic emissive layer having a second index of refraction; and (d) a second electrode disposed over the organic emissive layer;

(e) wherein the first index of refraction is higher than the second index of refraction.

12. The device of claim 11, wherein the organic emissive layer comprises a first small molecule organic material, wherein the first small molecule organic material is an emissive material that includes a bulky substituent.

13. The device of claim 11, wherein the organic emissive layer further comprises a second small molecule organic material, wherein the second small molecule organic material is a host material that includes a bulky substituent.

14. The device of claim 11, wherein the organic emissive layer includes a bulky dopant.

15. The device of claim 11, wherein the first index of refraction is at least 0.14 greater than the second index of refraction.

16. The device of claim 11, wherein the substrate has a non-planar surface on a side of the substrate opposite to the first electrode.

17. The device of claim 16, further comprising a lens disposed on the substrate, on a side of the substrate opposite to the first electrode.

18. The device of claim 17, wherein the lens has a third index of refraction, and wherein the difference between the first index of refraction and the third index of refraction is less than 0.1.

19. The device of claim 17, wherein the lens and the substrate are made of the same material and have the same index of refraction.

20. The device of claim 11, wherein the device further comprises one or more additional organic layers disposed between the first electrode and the second electrode.

21. The device of claim 11, wherein the coupling efficiency is 36% or greater.

22. An organic light emitting device, comprising:

a substrate;

a first electrode disposed over the substrate;

a small molecule organic emissive layer disposed over the first electrode, the organic emissive layer including a small molecule organic material including a bulky substituent;

a second electrode disposed over the organic emissive layer.

23. The device of claim 22, wherein the small molecule organic material including the bulky substituent is a host.

24. The device of claim 22, wherein the small molecule organic material including the bulky substituent is a dopant.

25. A device, comprising:

(a) a substrate having a first index of refraction;

(b) a first electrode disposed over the substrate;

(c) an organic emissive layer disposed over the first electrode, the organic emissive layer comprising a small molecule organic material, the organic emissive layer having a second index of refraction; and (d) a second electrode disposed over the organic emissive layer;

(e) wherein the first index of refraction is higher than the second index of refraction; and (f) further comprising a shaped element disposed on a side of the substrate opposite to the first electrode, and having a periodicity equal to that of the device.

26. The device of claim 25, wherein the first index of refraction is at least 0.14 greater than the second index of refraction.

27. The device of claim 25, wherein the first index of refraction is at least 1.85.

28. The device of claim 25, wherein the second index of refraction is at least 1.8.

29. The device of claim 25, wherein the device further comprises one or more additional organic layers disposed between the first electrode and the second electrode.

30. The device of claim 25, wherein the coupling efficiency is 36% or greater.

31. The device of claim 25, wherein the small molecule organic material includes a bulky substituent.

* * * * *

UNITED STATES PATENT AND TRADEMARK OFFICE
CERTIFICATE OF CORRECTION

PATENT NO.         : 7,053,547 B2
APPLICATION NO. : 10/305927
DATED              : May 30, 2006
INVENTOR(S)        : Lu et al.

It is certified that error appears in the above-identified patent and that said Letters Patent is hereby corrected as shown below:

Column 11, line 33, change "microvavity" to -- microcavity --

Column 12, line 12, change "enmitted" to -- emitted --

Column 21, line 43, change "intreface" to -- interface --

Signed and Sealed this

Tenth Day of October, 2006

JON W. DUDAS
*Director of the United States Patent and Trademark Office*